US012366679B2

(12) United States Patent
Gao et al.

(10) Patent No.: US 12,366,679 B2
(45) Date of Patent: Jul. 22, 2025

(54) METHOD AND DEVICE FOR IDENTIFYING FULL-SECTION EXCAVATION PARAMETERS OF LARGE-SECTION TUNNEL WITH BROKEN SURROUNDING ROCK

(71) Applicants: China Railway Eleventh Bureau Group Co., Ltd, Wuhan (CN); Wuhan
(Continued)

(72) Inventors: Jun Gao, Wuhan (CN); Zhongyi Zhang, Wuhan (CN); Xiao Lin, Wuhan (CN); Xiaowei Zuo, Wuhan (CN); Kaiwen Liu, Chengdu (CN); Ming Zhang, Wuhan (CN); Bin Zhou,
(Continued)

(73) Assignees: China Railway Eleventh Bureau Group Co., Ltd, Wuhan (CN); Wuhan University of Technology, Wuhan (CN); China Railway Eleventh Bureau Group Fourth Engineering Co., Ltd., Wuhan (CN); Wujiu Railway Passenger Dedicated Line Hubei Co., Ltd, Wuhan (CN); Southwest Jiaotong University, Chengdu (CN); China Railway Seventh Group Co., Ltd., Zhengzhou (CN); Wuhan Institute of Geotechnical Mechanics, Chinese Academy of Sciences, Wuhan (CN); China Railway Southwest Scientific Research Institute Co., Ltd, Chengdu (CN)

( * ) Notice: Subject to any disclaimer, the term of this patent is extended or adjusted under 35 U.S.C. 154(b) by 0 days.

(21) Appl. No.: 18/913,615

(22) Filed: Oct. 11, 2024

(65) Prior Publication Data
US 2025/0102701 A1    Mar. 27, 2025

Related U.S. Application Data

(63) Continuation of application No. PCT/CN2024/096940, filed on Jun. 3, 2024.

(30) Foreign Application Priority Data

Sep. 26, 2023  (CN) .......................... 202311253249.9

(51) Int. Cl.
G01V 20/00    (2024.01)
E21D 9/00    (2006.01)
(Continued)

(52) U.S. Cl.
CPC ............. *G01V 20/00* (2024.01); *E21D 9/006* (2013.01); *F42D 3/04* (2013.01); *G01J 5/0066* (2013.01);
(Continued)

(58) Field of Classification Search
None
See application file for complete search history.

(56) References Cited

FOREIGN PATENT DOCUMENTS

| AU | 2022274110 A1 | 2/2023 |
|---|---|---|
| CN | 107391841 A | 11/2017 |

(Continued)

OTHER PUBLICATIONS

Wang J, Cao A, Liu J, Wang H, Liu X, Li H, Sun Y, Long Y, Wu F. Numerical Simulation of Rock Mass Structure Effect on Tunnel Smooth Blasting Quality: A Case Study. Applied Sciences. 2021; 11(22):10761. https://doi.org/10.3390/app112210761 (Year: 2021).*
(Continued)

*Primary Examiner* — Lina Cordero
(74) *Attorney, Agent, or Firm* — Piloff Passino & Cosenza LLP; Rachel Piloff; Sean Passino

(57) ABSTRACT

Disclosed are a method and a device for identifying full-section excavation parameters of large-section tunnel with broken surrounding rock, capable of solving the problem of inaccurate arrangement of blasting hole points in tunnel excavation engineering, and including the following steps: establishing a three-dimensional finite element model based on a blasting section design of a tunnel; performing a simulation with the three-dimensional finite element model based on blasting design parameters to obtain blasting quality parameters; selecting a group closest to a preset
(Continued)

quality parameter from multiple groups of the blasting design parameters as target blasting design parameters, wherein the preset quality parameter is an acceptance grade standard of the tunnel; obtaining first thermal imaging information of a first hot spot of a surface to be blasted; calibrating actual hole spacing parameters based on the first thermal imaging information and the target blasting design parameters.

10 Claims, 5 Drawing Sheets

(71) Applicants: University of Technology, Wuhan (CN); China Railway Eleventh Bureau Group Fourth Engineering Co., Ltd., Wuhan (CN); Wujiu Railway Passenger Dedicated Line Hubei Co., Ltd, Wuhan (CN); Southwest Jiaotong University, Chengdu (CN); China Railway Seventh Group Co., Ltd., Zhengzhou (CN); Wuhan Institute of Geotechnical Mechanics, Chinese Academy of Sciences, Wuhan (CN); China Railway Southwest Scientific Research Institute Co., Ltd, Chengdu (CN)

(72) Inventors: Wuhan (CN); Feng Wang, Wuhan (CN); Yuxin Gao, Wuhan (CN); Huiling Xue, Wuhan (CN); Ling Wang, Wuhan (CN); Zhengyi Wang, Wuhan (CN); Xiaokai Wen, Wuhan (CN); Yongtai Wang, Wuhan (CN); Dan Xu, Wuhan (CN); Ke Chen, Wuhan (CN); Tenghui Xu, Wuhan (CN); Zhiguo Liu, Wuhan (CN); Yongguo Qi, Wuhan (CN); Geng Chen, Wuhan (CN); Songzhen Li, Wuhan (CN); Junlei Zhou, Wuhan (CN); Juntao Kang, Wuhan (CN); Chunfeng Meng, Wuhan (CN); Dongsheng Xu, Wuhan (CN); Linyue Gao, Chengdu (CN)

(51) Int. Cl.
  *F42D 3/04* (2006.01)
  *G01J 5/00* (2022.01)
  *G06F 30/23* (2020.01)

(52) U.S. Cl.
  CPC ...... *G06F 30/23* (2020.01); *G01J 2005/0077* (2013.01)

(56) References Cited

FOREIGN PATENT DOCUMENTS

| | | | |
|---|---|---|---|
| CN | 108930539 | A | 12/2018 |
| CN | 111101953 | A | 5/2020 |
| CN | 111485943 | A | 8/2020 |
| CN | 112576257 | A | 3/2021 |
| CN | 114183146 | A | 3/2022 |
| CN | 114963908 | A | 8/2022 |
| CN | 115325893 | A | 11/2022 |
| CN | 115690688 | A | 2/2023 |
| CN | 116187122 | A | 5/2023 |
| CN | 117332639 | A | 1/2024 |
| EP | 2237175 | A1 | 10/2010 |
| WO | 2022240048 | A1 | 11/2022 |

OTHER PUBLICATIONS

Tian, X., Tao, T., Liu, X. et al. Calculation of hole spacing and surrounding rock damage analysis under the action of in situ stress and joints. Sci Rep 12, 22331 (2022). https://doi.org/10.1038/s41598-022-27017-w (Year: 2022).*

L. Wenjuan, "A Study on Dynamic Response of Tunnel Blasting Using Numerical Simulation and Finite Element Analysis Software," 2023 International Conference on Mechatronics, IoT and Industrial Informatics (ICMIII), Melbourne, Australia, 2023, pp. 210-217, doi: 10.1109/ICMIII58949.2023.00046 (Year: 2023).*

T. Zhu, C. Wang, M. Zhang and Z. Pan, âA Cross-Platform for Tunnel Blast Design and Simulation,â 2011 International Conference on Virtual Reality and Visualization, Beijing, China, 2011, pp. 115-122, doi: 10.1109/ICVRV.2011.36 (Year: 2011).*

Zhao Ming-Sheng et al., "Intellectualized Design Software of Open Bench Blasting," Blasting, Date of issue: Jun. 15, 2018, pp. 76-83, vol. 35, No. 2. Claims involved: 1-10.

Li Wangxing et al., "Numerical Simulation of the Tunnel Blasting Process in Weak Intercalated Layer," Highway Engineering, Date of issue: Oct. 20, 2011, pp. 76-83, vol. 36, No. 05. Claims involved: 1-10.

Zhang Quanwang, "Research on Optimization of Deep Hole Differential Blasting Parameters for Foundation Pit in Central Urban Area," China Excellent Master's Dissertation Full-text Database Engineering Science and Technology Series II, No. 2. Date of issue: Feb. 15, 2023. Related pp. C028-50 Claims involved: 1-10.

Zheng Yaotao et al., "Optimization of Blasting Parameters and its Practice for Roadway Excavation in Xifeng Phosphate Mine in Guizhou Province," Blasting, Date of issue: Mar. 7, 2022, pp. 68-74+174, vol. 39, No. 1. Claims involved: 1-10.

Ruan Dixin, "Study on the Influence of Peripheral HoleBlasting Parameters on Over-excavation and Under-excavation of Tunnels and Parameter Optimization," China Excellent Master's Dissertation Full-text Database Engineering Science and Technology Series II, No. 1. Date of issue: Jan. 15, 2023. Related pp. C034-C623 Claims involved: 1-10.

Wang Dongwang et al., "Optimization of Blast Hole Spacing Based on Numerical Simulation Technology," Energy and Energy Conservation, Date of issue: Sep. 5, 2022, pp. 204-206, No. 8. Claims involved: 1-10.

Huaming An et al., "Hybrid Finite-Discrete Element Modelling of Excavation Damaged Zone Formation Process Induced by Blasts in a Deep Tunnel," Advances in Civil Engineering, Date of issue: Jul. 16, 2020, pp. 1-27. Claims involved: 1-10.

Uniform Resource Locator(URL): https://wenku.baidu.com/viewc52198e6d7d8d15abe23482fb Network release day or public day: May 3, 2023 Title: PPT—Baidu Library of Tunnel Controlled Blasting and Overexcavation Control Courseware relevant portion: 1-127 Claims involved: 1-10.

First Office Action for China Application No. 202311253249.9, mailed Mar. 26, 2024.

Notification to Grant Patent for China Application No. 202311253249.9, mailed May 30, 2024.

First Search Report for China Application No. 202311253249.9, dated Mar. 19, 2024.

Supplementary Search Report for China Application No. 202311253249.9, dated May 17, 2024.

* cited by examiner

METHOD AND DEVICE FOR IDENTIFYING FULL-SECTION EXCAVATION PARAMETERS OF LARGE-SECTION TUNNEL WITH BROKEN SURROUNDING ROCK

CROSS-REFERENCE TO RELATED APPLICATIONS

This application is a continuation of PCT/CN2024/096940, filed on Jun. 3, 2024 and claims priority of Chinese Patent Application No. 202311253249.9, filed on Sep. 26, 2023, the entire contents of which are incorporated herein by reference.

TECHNICAL FIELD

The disclosure relates to the technical field of tunnel engineering, and in particular to a method and a device for identifying full-section excavation parameters of large-section tunnel with broken surrounding rock.

BACKGROUND

Smooth blasting is widely used in tunnel excavation, especially in tunnels with weak and broken surrounding rocks, because smooth blasting is characterized by reducing the underbreak amount, less damage to surrounding rocks, smooth and flat contour surface after blasting excavation and effectively reducing the cost. The selection of blasting parameters and the reliability of construction technology are particularly important for the final effect of smooth blasting. However, in the actual field operation of tunnel excavation, there are often problems that the construction personnels improperly arrange blasting parameters and affect the final blasting effect.

SUMMARY

A method and a device for identifying full-section excavation parameters of large-section tunnel with broken surrounding rock provided by the embodiment of the disclosure may at least solve the problem of inaccurate arrangement of blastholes in tunnel excavation engineering.

The first aspect of the embodiment of the application provides a method for identifying full-section excavation parameters of large-section tunnel with broken surrounding rock, including the following steps:

establishing a three-dimensional finite element model based on a blasting section design of a tunnel;
performing a simulation with the three-dimensional finite element model based on blasting design parameters to obtain blasting quality parameters;
selecting a group closest to a preset quality parameter from multiple groups of the blasting design parameters as target blasting design parameters, where the preset quality parameter is an acceptance grade standard of the tunnel;
obtaining first thermal imaging information of a first hot spot of a surface to be blasted, where the first hot spot is a same heat source generating unit arranged at a selected blasting hole point actually measured on the surface to be blasted based on the target blasting design parameters before a blasting hole arrangement;
calibrating actual hole spacing parameters based on the first thermal imaging information and the target blasting design parameters.

Optionally, the method also includes:
obtaining second thermal imaging information of a second hot spot of the surface to be blasted after the blasting hole arrangement, where the second hot spot is the same heat source generating unit arranged in the blasting hole after the blasting hole arrangement; and
calibrating actual hole diameter parameters based on the second thermal imaging information and the target blasting design parameters.

Optionally, calibrating the actual hole diameter parameters based on the second thermal imaging information and the target blasting design parameters includes:
determining a heat concentration range of each second hot spot based on the second thermal imaging information;
predicting an actual hole diameter of each actual hole after the blasting hole arrangement based on the heat concentration range; and
calibrating the actual hole diameter according to the target blasting design parameters.

Optionally, the blasting section design includes groundwater information of the tunnel.

Optionally, the blasting quality parameters include average linear overbreak amount; and
the preset quality parameters include preset linear overbreak amount.

Optionally, the blasting quality parameters further include local underbreak amount; and
the preset quality parameters include preset local underbreak amount.

Optionally, performing a numerical simulation based on multiple groups of the blasting design parameters and the three-dimensional finite element model to obtain the blasting quality parameters, including:
determining a surrounding rock grade based on rock mass properties of the tunnel;
determining crustal stress of a surrounding rock based on the surrounding rock grade; and
performing the numerical simulation based on the crustal stress of the surrounding rock to obtain the blasting quality parameters.

The second aspect of the embodiment of the application provides a device for identifying full-section excavation parameters of large-section tunnel with broken surrounding rock, including:
an establishment unit, used for establishing a three-dimensional finite element model based on a section design and a blasting design of a tunnel;
a simulation unit, used for performing a simulation with the three-dimensional finite element model based on multiple groups of blasting design parameters to obtain blasting quality parameters;
a selection unit, used for selecting a group closest to a preset quality parameter from multiple groups of the blasting design parameters as target blasting design parameters, where the preset quality parameter is an acceptance grade standard of the tunnel;
an imaging unit, used for obtaining first thermal imaging information of a first hot spot of a surface to be blasted, where the first hot spot is a same heat source generating unit arranged at a selected blasting hole point actually measured on the surface to be blasted based on the target blasting design parameters before a blasting hole arrangement; and
a calibration unit, used for calibrating actual hole spacing parameters based on the first thermal imaging information and the target blasting design parameters.

The third aspect of the embodiment of the application provides an electronic device, which includes at least one processor and at least one memory connected with the processor, where the processor is used for calling program instructions in the memory to execute the method for identifying full-section excavation parameters of large-section tunnel with broken surrounding rock.

The fourth aspect of the embodiment of the application provides a storage medium, which includes a stored program, where when the program runs, the device where the storage medium is located is controlled to execute the method for identifying full-section excavation parameters of large-section tunnel with broken surrounding rock described in any one of the first aspects.

To sum up, a method for identifying full-section excavation parameters of large-section tunnel with broken surrounding rock provided by the embodiment of the application includes the following steps: establishing a three-dimensional finite element model based on a blasting section design of a tunnel; performing a simulation with the three-dimensional finite element model based on blasting design parameters to obtain blasting quality parameters; selecting a group closest to a preset quality parameter from multiple groups of the blasting design parameters as target blasting design parameters, where the preset quality parameter is an acceptance grade standard of the tunnel; obtaining first thermal imaging information of a first hot spot of a surface to be blasted, where the first hot spot is a same heat source generating unit arranged at a selected blasting hole point actually measured on the surface to be blasted based on the target blasting design parameters before a blasting hole arrangement; calibrating actual hole spacing parameters based on the first thermal imaging information and the target blasting design parameters. According to the method provided by the embodiment of the disclosure, a three-dimensional finite element model is established based on the actual situation of the tunnel, and multiple groups of blasting design parameters are adopted to carry out blasting simulation on the three-dimensional finite element model, so that different blasting quality parameters are obtained, and the optimal blasting design parameters are selected as the target blasting design parameters, so that the accuracy of the selection of blasting design parameters is improved. According to the above-mentioned target blasting design parameters, the field construction personnel arrange the same heat source generating units on the surface to be blasted based on the actual measurement, so as to obtain the heat map of the information of the blasting holes on the section to be blasted; the heat map is compared with the above-mentioned target blasting design parameters to obtain the rectangular coordinates of each blasting hole corresponding to the first hot spot based on the heat map, so as to obtain the hole spacing of the blasting holes marked on the surface to be blasted; the hole spacing is compared with the hole spacing in the target blasting design parameters, so that the blasting holes marked with deviation may be found comprehensively and quickly, and then the problem of inaccurate hole point arrangement in tunnel excavation engineering may be solved.

Correspondingly, a device for identifying full-section excavation parameters of large-section tunnel with broken surrounding rock provided by the embodiment of the application also has the above technical effects.

BRIEF DESCRIPTION OF THE DRAWINGS

Various other advantages and benefits will become clear to those skilled in the art by reading the following detailed description of preferred embodiments. The drawings are only for the purpose of illustrating the preferred embodiment, and are not considered as limiting the application. Moreover, like parts are denoted by like reference symbols throughout the drawings. In the attached drawings.

DETAILED DESCRIPTION OF THE EMBODIMENTS

The embodiment of the disclosure provides a method and equipment for identifying parameters of full-section excavation of a large-section tunnel with broken surrounding rock, which may at least solve the problem of inaccurate arrangement of blasting holes in tunnel excavation engineering.

The terms "first", "second", "third", "fourth" and so on (if any) in the specification and claims of this application and the above drawings are used to distinguish similar objects, and are not necessarily used to describe a specific order or sequence. It should be understood that the data thus used may be interchanged under appropriate circumstances, so that the embodiments described herein may be implemented in other orders than those illustrated or described herein. Furthermore, the terms "including" and "having" and any variations thereof are intended to cover non-exclusive inclusion, for example, a process, method, system, product or equipment that includes a series of steps or units is not necessarily limited to those explicitly listed, but may include other steps or units not explicitly listed or inherent to such processes, methods, products or equipment. In the following, the technical scheme in the embodiment of the application will be clearly and completely described with reference to the drawings in the embodiment of the application. Obviously, the described embodiment is only a part of the embodiment of the application, but not the whole embodiment.

Figure 1:
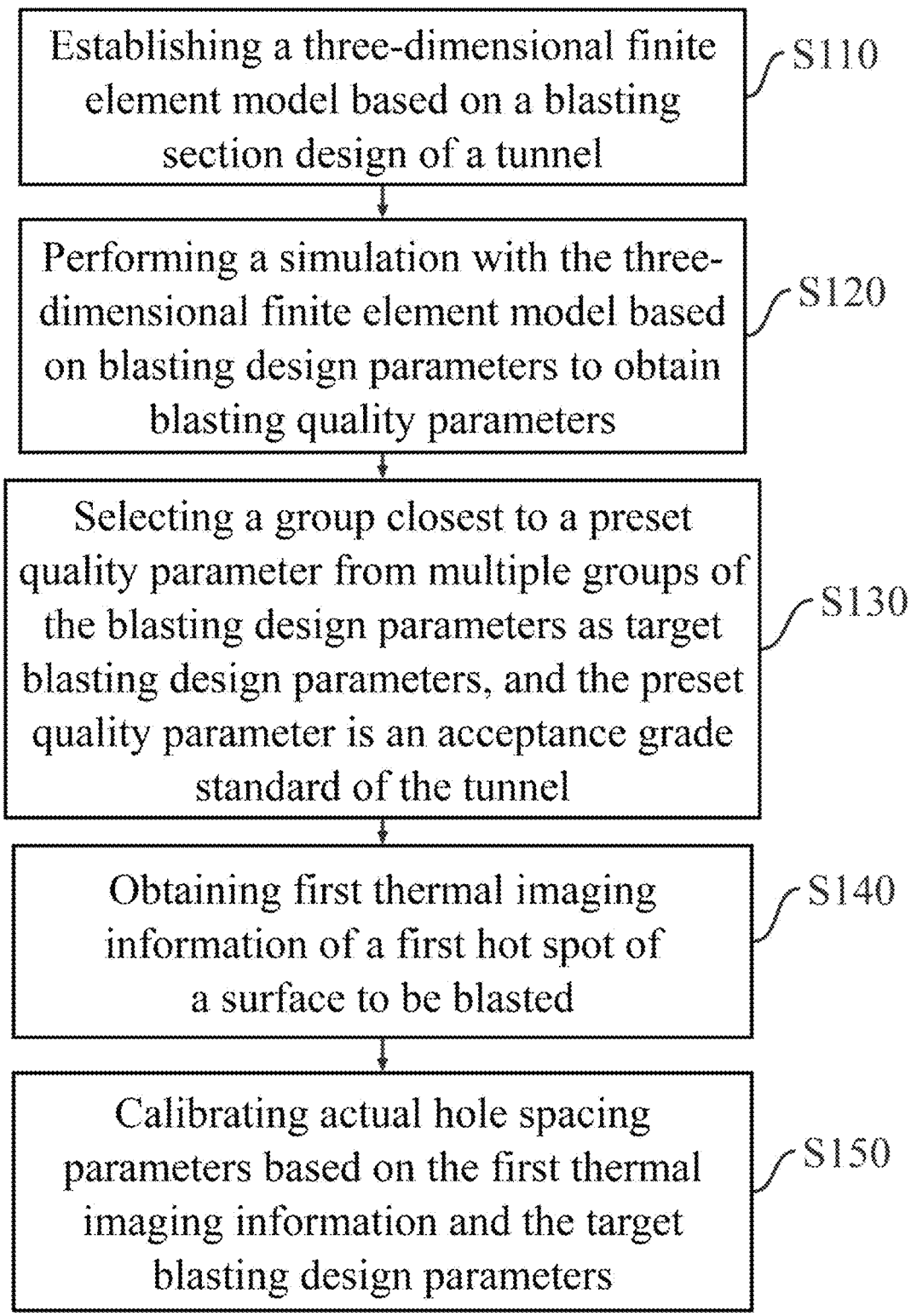
FIG. 1 is a possible schematic flow chart of a method for identifying full-section excavation parameters of large-section tunnel with broken surrounding rock provided by an embodiment of the present application.

With reference to FIG. 1, which is a schematic flow chart of a method for identifying full-section excavation parameters of large-section tunnel with broken surrounding rock provided by the embodiment of this application, specifically including S110-S150.

S110, establishing a three-dimensional finite element model based on a blasting section design of a tunnel;

For example, the above-mentioned blasting section design may obtain the external structural parameters such as the outline, span and height of the blasting section, as well as the internal structural parameters of the surrounding rock where the tunnel is located, including the structural parameters such as the gauge, shape and density of the surrounding rock. Based on the above-mentioned structural parameters, the three-dimensional finite element model may be established by using LS-DYNA and other software. Meanwhile, the above-mentioned three-dimensional finite element model may also simulate the information such as air, rock and soil according to the actual situation.

S120, performing a simulation with the three-dimensional finite element model based on blasting design parameters to obtain blasting quality parameters;

For example, the above-mentioned blasting design parameters include appropriate parameters selected by blasting designers based on engineering characteristics, geological conditions, technical methods, equipment types, equipment selection, environmental conditions and engineering requirements, etc., according to empirical formulas and combined with construction experience, or through field tests, including at least: hole diameter, hole spacing, hole depth, smooth blasting layer thickness, linear charge density and decoupling coefficient, etc., which are not limited in this application document, and are based on engineering practice. The above blasting quality parameters are indicators for evaluating the quality of smooth blasting, such as slope flatness.

It should be noted that multiple groups of blasting design parameters may be listed based on different calculation coefficients or different formulas, and each group of blasting design parameters may be simulated on the same three-dimensional finite element model, so as to obtain multiple groups of blasting quality parameters.

S130, selecting a group closest to a preset quality parameter from multiple groups of the blasting design parameters as target blasting design parameters, and the preset quality parameter is an acceptance grade standard of the tunnel.

For example, the preset quality parameters are determined according to the field engineering practice and relevant design specifications and industry standards. It is easy to understand that the acceptance grade parameters are different according to the different lithology of the tunnel. For example, if the tunnel lithology is medium hard rock, the semi-porosity is usually greater than 75%, while for hard rock, the semi-porosity is usually greater than 90%. The preset quality parameters are used to represent the parameters corresponding to the acceptance grade standard of the current tunnel. The group closest to the preset quality parameter may be selected as the target blasting design parameter from the multiple groups of blasting quality parameters, and the closest group represents the group with the best simulated blasting effect, so group closest to the preset quality parameter may be used as the blasting design parameter for practical application.

S140, obtaining first thermal imaging information of a first hot spot of a surface to be blasted.

For example, the first hot spot is the same heat source generating unit arranged at the selected blasting hole point on the surface to be blasted based on the target blasting design parameters before the blasting hole arrangement; the above-mentioned heat source generating unit may include a thermistor, an electric heating wire, etc., which may emit heat which is quite different from the tunnel ambient temperature, and is not specifically limited. The same heat source generating units are arranged at all marked blasting hole positions on the surface to be blasted, so that the first thermal imaging information reflecting the first hot spots corresponding to all marked blasting hole positions may be obtained, that is, the heat map. From the heat map, the spacings of the first hot spots corresponding to all marked blasting hole positions may be obtained comprehensively and quickly, which may be realized by establishing a central coordinate system, and then the hole spacings of all marked blasting holes may be obtained.

S150, calibrating actual hole spacing parameters based on the first thermal imaging information and the target blasting design parameters.

For example, the above-mentioned actual hole spacing refers to the hole spacing of blasting holes actually arranged on the surface to be blasted in tunnel excavation engineering. It may be explained that surveyors measure and set out the blasting surface to be blasted according to the target blasting design parameters, mark the position of blasting holes on the surface to be blasted with red paint or other means based on the target blasting design parameters, and the construction personnel arrange blasting holes based on the marked positions. However, there may be deviations in the marking process, which will lead to the deviation between the actual arrangement of blasting holes and the target blasting design position, resulting in unsatisfactory smooth blasting effect and even serious overbreak and other problems that affect the engineering quality. By comparing the spacings of the first hot spots on the first thermal imaging information, the hole spacing of each marked blasting hole may be obtained comprehensively and quickly, and the hole spacing may be compared with the hole spacing of each blasting hole in the target blasting design parameters, so that the blasting hole with deviation may be obtained quickly and accurately, so that the field personnel may readjust the above-mentioned blasting hole with the deviation to meet the requirements in the target blasting design parameters.

According to the method for identifying full-section excavation parameters of large-section tunnel with broken surrounding rock provided in the above embodiment, a three-dimensional finite element model may be established based on the actual situation of the tunnel, and multiple groups of blasting design parameters are adopted to carry out blasting simulation on the three-dimensional finite element model, so that different blasting quality parameters are obtained, and the optimal blasting design parameters are selected as the target blasting design parameters, which improves the accuracy of selecting the blasting design parameters. According to the above-mentioned target blasting design parameters, the field construction personnel arrange the same heat source generating units on the surface to be blasted based on the actual measurement, so as to obtain the heat map of the surface to be blasted containing the hole point information of all blasting holes, compare the heat map with the above-mentioned target blasting design parameters, and obtain the rectangular coordinates of each blasting hole corresponding to the first hot spot based on the heat map, so as to obtain the hole spacing of the blasting holes marked on the surface to be blasted, and compare the hole spacing with the hole spacing in the target blasting design parameters, so that the blasting holes marked with deviation may be found comprehensively and quickly, and then the problem of inaccurate hole point arrangement in tunnel excavation engineering may be solved.

According to some embodiments, the second thermal imaging information of the second hot spot of the surface to be blasted after the blasting hole arrangement is collected, where the second hot spot is the same heat source generating unit arranged in the hole after the blasting hole arrangement; and based on the second thermal imaging information and the target blasting design parameters, the actual hole diameter parameters are calibrated.

For example, after the on-site construction personnel complete the drilling task of blasting holes, the same heat source generating unit may be arranged in the interior of each blasting hole, and a plurality of hot spots may be formed to correspond to the blasting holes, so that the thermal imaging information corresponding to each blasting hole may be obtained from the plurality of hot spots.

According to some embodiments, calibrating the actual hole diameter parameters based on the second thermal imaging information and the target blasting design parameters includes:

determining a heat concentration range of each second hot spot based on the second thermal imaging information;

predicting the actual hole diameter of each actual hole after blasting hole arrangement based on the heat concentration range; and calibrating the actual hole diameter according to the target blasting design parameters.

For example, because the blasting hole may isolate the external heat, the heat emitted by the heat source generating unit in the blasting hole will be confined in the blasting hole, and the heat concentration range of each hot spot is determined from the thermal imaging information obtained by the heat source generating unit in each blasting hole, which may reflect the actual hole diameter of each blasting hole after the construction personnel in the field finish drilling. Therefore, the range of heat concentration of different hot spots in the heat map formed from the hot spots may reflect the actual hole diameter of each blasting hole, and the deviated holes are calibrated according to the comparison between the actual hole diameter and the hole diameter in the target blasting design parameters.

According to the method for identifying the full-section excavation parameters of a large-section tunnel with broken surrounding rock provided by the above embodiment, after the construction personnels finish the drilling task, the same heat source generating unit may be arranged for each blasting hole, and the corresponding hole diameter may be determined according to the heat concentration range generated by each heat source, so that the actual hole diameter of each blasting hole may be comprehensively and quickly identified from the thermodynamic diagram formed by the heat source generating unit, and the actual hole diameter may be compared with the hole diameter in the target blasting design parameters, so that the blasting hole with the deviation in the drilling task may be identified. The method provided by the embodiment of the application may comprehensively and quickly judge the blasting holes with deviated hole diameter, and prevent the occurrence of serious engineering quality problems caused by the unsatisfactory setting of smooth blasting effect due to the fact that the blasting hole diameter does not meet the design requirements, and it is unnecessary to carry out secondary measurement on each blasting hole, thus speeding up the project progress.

According to some embodiments, the design of blasting section includes the groundwater information of tunnel.

For example, the groundwater information in the surrounding rock of the tunnel may be detected by the groundwater detector and other related equipment. It should be noted that groundwater may soften the surrounding rock and reduce the strength of the surrounding rock itself, which will affect the original blasting design parameters. Based on the obtained groundwater information and the internal structural characteristics of surrounding rock, the strength of surrounding rock may be re-judged, so as to make the blasting design parameters more in line with the actual geological conditions, thus improving the blasting effect of smooth blasting, and even avoiding the serious engineering quality and even the problem of tunnel collapse caused by misjudging the strength of surrounding rock.

According to some embodiments, blasting quality parameters include average linear overbreak amount; and the preset quality parameters include the preset linear overbreak amount.

For example, in tunnel excavation engineering, overbreak will increase the amount of slag and lining, which will increase the project cost, and also affect the overall flatness of surrounding rock and stress concentration, and affect the stability of surrounding rock, especially in the case of weak and broken surrounding rock, overbreak is an important index to evaluate the quality parameters of smooth blasting. According to the embodiment of the application, a three-dimensional finite element model is constructed through the design of the blasting section based on the tunnel, and smooth blasting simulation is carried out on the three-dimensional finite element model to obtain blasting quality parameters, where the blasting quality parameters include the average linear overbreak amount, and the preset linear overbreak amount may be set according to the engineering category, site reality and relevant specifications without specific limitation, and the optimal parameters may be obtained by comparing the simulated average linear overbreak amount based on multiple groups of blasting design parameters with the preset linear overbreak amount.

According to some embodiments, blasting quality parameters also include local underbreak amount; and the preset quality parameters include the preset local underbreak amount.

For example, in tunnel excavation engineering, underbreak will affect the lining thickness after blasting, which will cause hidden dangers to the quality and safety of the project, and for some structural parts of the tunnel, underbreak is not allowed. In the embodiment of the application, a three-dimensional finite element model is constructed based on the blasting section design of the tunnel, and smooth blasting simulation is carried out on the three-dimensional finite element model to obtain blasting quality parameters, where the blasting quality parameters include local underbreak amount, and the preset local underbreak amount may be set according to the engineering category, site reality and relevant specifications without specific limitation, and the optimal parameters are obtained by comparing the simulated local underbreak amount based on multiple groups of blasting design parameters with the preset local underbreak amount.

According to some embodiments, performing numerical simulation based on multiple groups of blasting design parameters and three-dimensional finite element model to obtain blasting quality parameters includes:

determining the surrounding rock grade based on the rock mass properties of the tunnel;

determining crustal stress of the surrounding rock based on surrounding rock grade; and obtaining the blasting quality parameters by numerical simulation based on the crustal stress of surrounding rock.

For example, the influence of crustal stress of surrounding rock of tunnel may be added in the process of blasting simulation with three-dimensional finite element model to obtain blasting design parameters more in line with actual geological conditions. According to the detected rock mass properties of the tunnel, the corresponding surrounding rock grade is determined based on the engineering rock mass classification standards, railway tunnel design specifications and other related data, and the crustal stress of surrounding rock is calculated according to the surrounding rock grade and the actual situation on site. If the groundwater information of surrounding rock is detected, the influence of groundwater on the strength of surrounding rock should also be considered.

The method for identifying full-section excavation parameters of large-section tunnel with broken surrounding rock in the embodiment of this application has been described above, and the device for identifying full-section excavation parameters of large-section tunnel with broken surrounding rock in the embodiment of this application will be described below.

Figure 2:
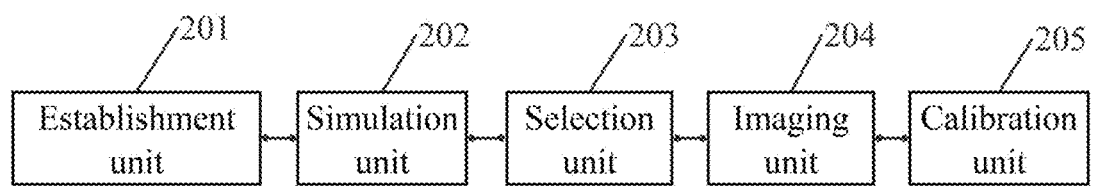
FIG. 2 is a possible schematic block diagram of a device for identifying full-section excavation parameters of large-section tunnel with broken surrounding rock provided by the embodiment of the application.

With reference to FIG. 2, an embodiment of a device for identifying full-section excavation parameters of large-section tunnel with broken surrounding rock described in the embodiment of the application may include:

the establishment unit 201 is used for establishing a three-dimensional finite element model based on the cross-section design of the tunnel;

the simulation unit 202 is used for performing numerical simulation based on multiple groups of blasting design parameters and the three-dimensional finite element model to obtain blasting quality parameters;

the selection unit 203 is used for selecting a group closest to a preset quality parameter from multiple groups of the blasting design parameters as target blasting design parameters, where the preset quality parameter is an acceptance grade standard of the tunnel;

the imaging unit 204 is used for obtaining first thermal imaging information of a first hot spot of a surface to be blasted, where the first hot spot is a same heat source generating unit arranged at a selected blasting hole point actually measured on the surface to be blasted based on the target blasting design parameters before a blasting hole arrangement;

the calibration unit 205 is used for calibrating actual hole spacing parameters based on the first thermal imaging information and the target blasting design parameters.

According to the full-section excavation parameter identification device for large-section tunnel with broken surrounding rock provided in the above embodiment, a three-dimensional finite element model is established through the blasting section design based on the tunnel; based on multiple groups of blasting design parameters and three-dimensional finite element model, the blasting quality parameters are obtained by simulation; a group closest to a preset quality parameter is selected from multiple groups of blasting design parameters as a target blasting design parameter, where the preset quality parameter is the acceptance grade standard of the tunnel; obtaining first thermal imaging information of a first hot spot of a surface to be blasted, where the first hot spot is the same heat source generating unit arranged at the selected blasting hole point of the surface to be blasted based on the actual measurement of the target blasting design parameters before the blasting hole arrangement; based on the first thermal imaging information and the target blasting design parameters, the actual hole spacing parameters are calibrated. According to the method provided by the embodiment of the disclosure, a three-dimensional finite element model may be established based on the actual situation of the tunnel, and multiple groups of blasting design parameters are adopted to carry out blasting simulation on the three-dimensional finite element model, so that different blasting quality parameters are obtained, and the optimal blasting design parameters are selected as target blasting design parameters, so that the accuracy of selecting blasting design parameters is improved. According to the above-mentioned target blasting design parameters, the construction personnel arrange the same heat source generating units on the surface to be blasted based on the actual measurement and selection of blasting hole points, so as to obtain the heat map of the section to be blasted containing the blasting hole point information of all the blasting holes, the heat map with the above-mentioned is compared with target blasting design parameters, so as to quickly and accurately identify the blasting holes with the deviation of the blasting hole point arrangement based on the thermal imaging spacing of each blasting hole, thus solving the problem of inaccurate blasting hole point arrangement in tunnel excavation engineering.

Figure 3:
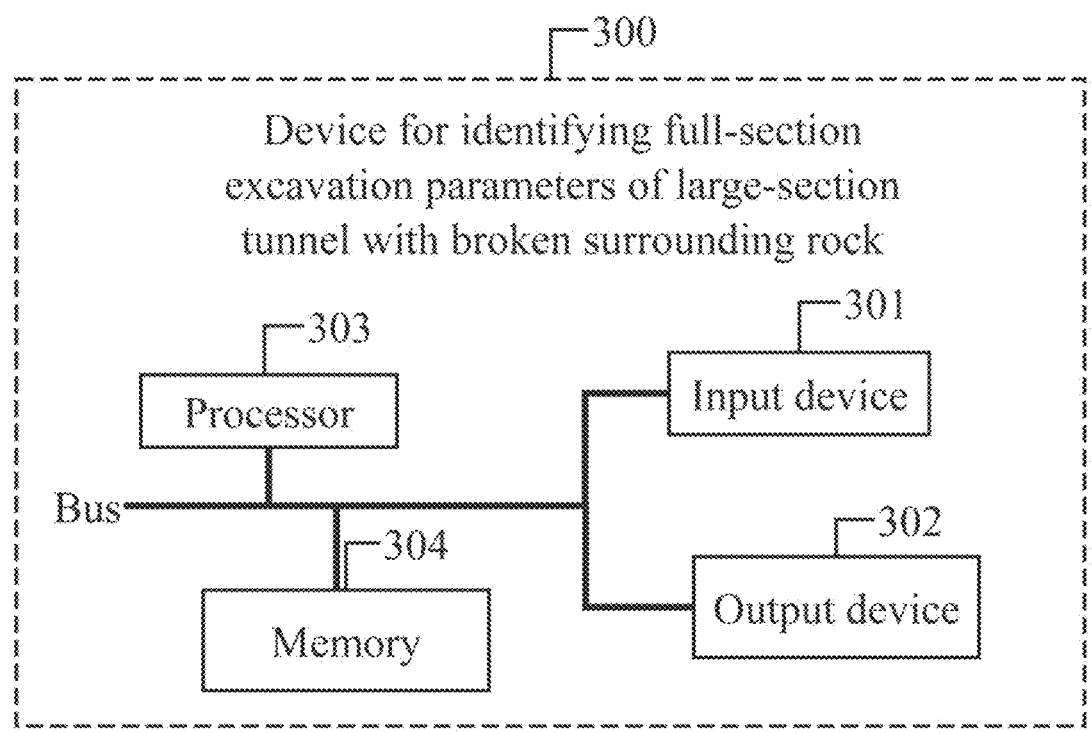
FIG. 3 is a possible schematic diagram of the hardware structure of a device for identifying full-section excavation parameters of large-section tunnel with broken surrounding rock provided by the embodiment of the present application.

FIG. 2 above describes the device for identifying full-section excavation parameters of large-section tunnel with broken surrounding rock in the embodiment of this application from the perspective of modular functional entities, and the device for identifying full-section excavation parameters of large-section tunnel with broken surrounding rock in the embodiment of this application is described in detail from the perspective of hardware processing. With reference to FIG. 3, an embodiment of the device for identifying full-section excavation parameters of large-section tunnel with broken surrounding rock in the embodiment of this application includes:

an input device 301, an output device 302, a processor 303 and a memory 304, where the number of the processors 303 may be one or more, and one processor 303 is taken as an example in FIG. 3. In some embodiments of the present application, the input device 301, the output device 302, the processor 303 and the memory 304 may be connected by a bus or other means, among which, the connection by a bus is taken as an example in FIG. 3.

The processor 303 is used for executing the steps of the method according to any one of the first aspects by calling the operation instructions stored in the memory 304.

Figure 4:
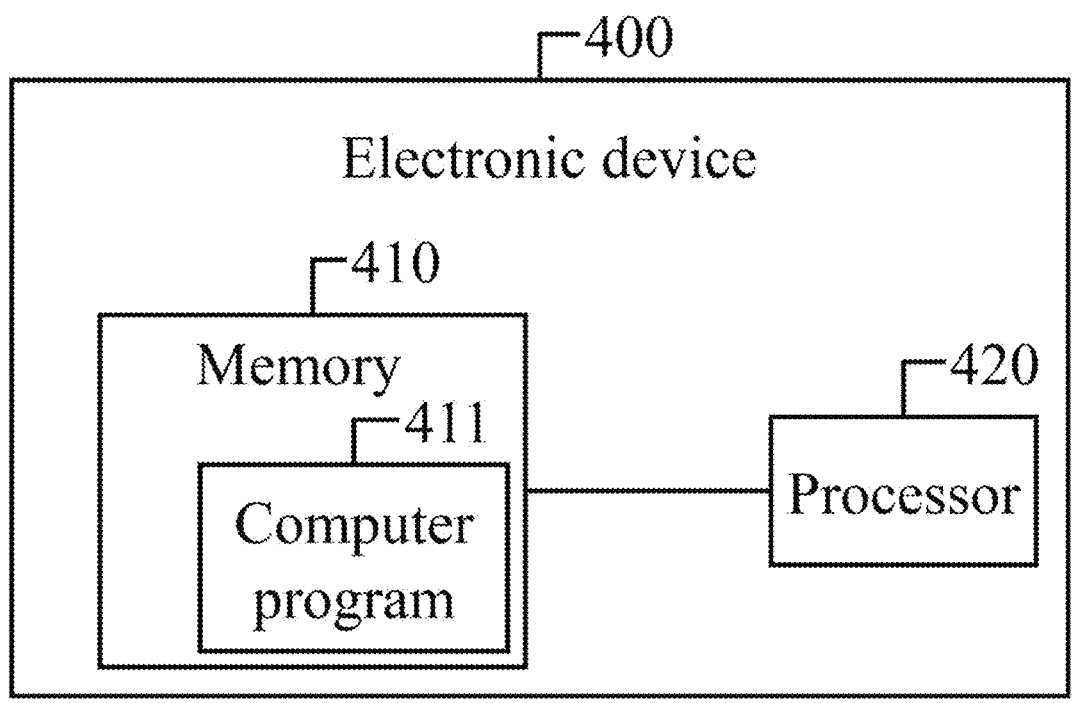
FIG. 4 is a possible schematic structural block diagram of an electronic device provided by an embodiment of the present application.

FIG. 4 is a schematic diagram of an embodiment of an electronic device provided by an embodiment of the present application.

As shown in FIG. 4, the embodiment of the application provides an electronic device 400, which includes a memory 410, a processor 420 and a computer program 411 stored in the memory 410 and executable on the processor 420. When the processor 420 executes the computer program 411, the steps of the method described in any one of the first aspects are realized.

In a specific implementation process, when the processor 420 executes the computer program 411, any one of the corresponding embodiments in FIG. 1 may be realized.

Because the electronic equipment introduced in this embodiment is the equipment used to implement a system resource management device in this embodiment of the application, based on the method introduced in this embodiment of the application, the technicians in this field may understand the specific implementation of the electronic equipment in this embodiment and its various variations, so how to implement the method in this embodiment of the application for this electronic equipment is not described in detail here, as long as the equipment used by the technicians in this field to implement the method in this embodiment of the application belongs to this application.

Figure 5:
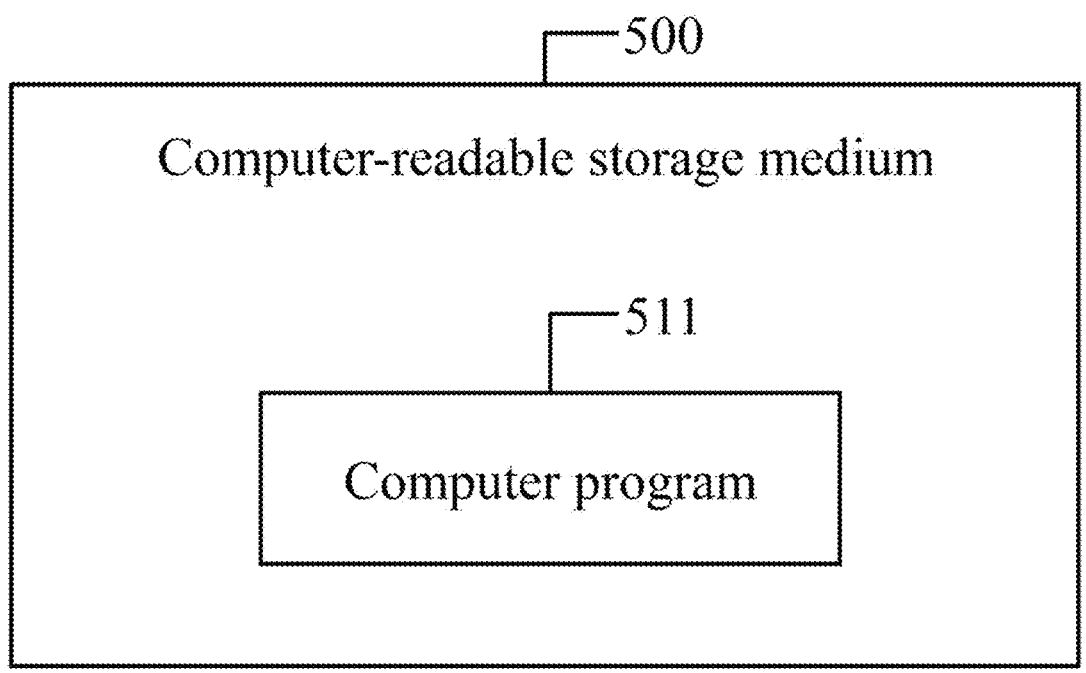
FIG. 5 is a possible schematic structural block diagram of a computer-readable storage medium provided by an embodiment of the present application.

FIG. 5 is a schematic diagram of an embodiment of a computer-readable storage medium provided by an embodiment of the present application.

As shown in FIG. 5, this embodiment provides a computer-readable storage medium 500, on which a computer program 511 is stored, and the computer program 511, when executed by a processor, realizes the steps of the method described in any one of the first aspects.

It should be noted that in the above-mentioned embodiments, the description of each embodiment has its own emphasis, and for the parts not described in detail in one embodiment, please refer to the relevant descriptions of other embodiments.

It should be understood by those skilled in the art that embodiments of the present application may be provided as a method, a system, or a computer program product. Therefore, this application may take the form of an entirely hardware embodiment, an entirely software embodiment, or a practical example combining software and hardware aspects. Moreover, this application may take the form of a computer program product implemented on one or more computer-usable storage media (including but not limited to disk storage, compact disc read-only memory (CD-ROM), optical storage, etc.) containing computer-usable program codes.

The present application is described with reference to flowcharts and/or block diagrams of methods, devices (systems) and computer program products according to embodiments of the present application. It should be understood that each flow and/or block in the flowchart and/or block diagram, and combinations of the flow and/or block in the flowchart and/or block diagram may be implemented by computer program instructions. These computer programs may be provided to direct a processor of a general-purpose computer, a special-purpose computer, an embedded computer or other programmable data processing apparatus to produce a machine, so that the instructions executed by the processor of the computer or other programmable data processing apparatus produce means for implementing the functions specified in one or more flow charts and/or block diagrams.

These computer program instructions may also be stored in a computer-readable memory that may direct a computer or other programmable data processing apparatus to operate in a particular manner, such that the instructions stored in the computer-readable memory produce an article of manufacture including instruction means that implement the functions specified in one or more flow charts and/or block diagrams.

These computer program instructions may also be loaded onto a computer or other programmable data processing apparatus, such that a series of operational steps are performed on the computer or other programmable apparatus to produce a computer-implemented process, such that the instructions executed on the computer or other programmable apparatus provide steps for implementing the functions specified in the flowchart flow or flows and/or block or blocks in the block diagram.

The embodiment of the application also provides a computer program product, which includes computer software instructions, and when the computer software instructions run on the processing equipment, the processing equipment is enabled to execute the flow in the method for identifying full-section excavation parameters of large-section tunnel with broken surrounding rock in the corresponding embodiment of FIG. 1.

The computer program product includes one or more computer instructions. When the computer program instructions are loaded and executed on a computer, the flow or function according to the embodiment of the application is generated in whole or in part. The computer may be a general-purpose computer, a special-purpose computer, a computer network, or other programmable devices. The computer instructions may be stored in a computer-readable storage medium or transmitted from one computer-readable storage medium to another. For example, the computer instructions may be transmitted from a website, a computer, a server or a data center to another website or computer by wired (such as coaxial cable, optical fiber, digital subscriber line, DSL)) or wireless (such as infrared, wireless, microwave, etc.). The computer-readable storage medium may be any available medium that a computer may store or a data storage device such as a server, data center, etc. which contains one or more available media integration. The usable medium may be a magnetic medium (e.g., floppy disk, hard disk, magnetic tape), an optical medium (e.g., DVD), or a semiconductor medium (e.g., solid state disk (SSD)) and the like.

It may be clearly understood by those skilled in the art that for the convenience and conciseness of description, the specific working processes of the systems, devices and units described above may refer to the corresponding processes in the aforementioned method embodiments, and will not be repeated here.

In several embodiments provided by this application, it should be understood that the disclosed systems, devices and methods may be realized in other ways. For example, the device embodiment described above is only schematic. For example, the division of the units is only a logical function division. In actual implementation, there may be other division methods, such as multiple units or components may be combined or integrated into another system, or some features may be ignored or not implemented. On the other hand, the mutual coupling or direct coupling or communication connection shown or discussed may be indirect coupling or communication connection through some interfaces, devices or units, which may be electrical, mechanical or other forms.

The units described as separate components may or may not be physically separated, and the components shown as units may or may not be physical units, that is, they may be located in one place or distributed to multiple network units. Some or all of the units may be selected according to actual needs to achieve the purpose of this embodiment.

In addition, each functional unit in each embodiment of the application may be integrated into one processing unit, or each unit may exist physically alone, or two or more units may be integrated into one unit. The above-mentioned integrated unit may be realized in the form of hardware or software functional units.

The integrated unit may be stored in a computer-readable storage medium if it is realized in the form of a software functional unit and sold or used as an independent product. Based on this understanding, the technical scheme of this application may be embodied in the form of software products, which are stored in a storage medium and include several instructions to make a computer device (which may be a personal computer, a server, a network device, etc.) execute all or part of the steps of the method described in various embodiments of this application. The aforementioned storage media include: USB flash disk, mobile hard disk, read-only memory, ROM), random access memory, RAM), magnetic disk or optical disk and other media that may store program codes.

As mentioned above, the above embodiments are only used to illustrate the technical scheme of the application, but not to limit it. Although the present application has been described in detail with reference to the foregoing embodiments, it should be understood by those skilled in the art that the technical solutions described in the foregoing embodiments may still be modified or some technical features thereof may be equivalently replaced. However, these modifications or substitutions do not make the essence of the corresponding technical solutions deviate from the spirit and scope of the technical solutions of various embodiments of this application.

What is claimed is:

1. A method for identifying full-section excavation parameters of a tunnel with broken surrounding rock, comprising:
   establishing a three-dimensional finite element model based on a blasting section design of the tunnel;
   performing a simulation with the three-dimensional finite element model based on multiple groups of blasting design parameters to obtain blasting quality parameters;
   selecting a group closest to a preset quality parameter from the multiple groups of the blasting design parameters as target blasting design parameters, wherein the preset quality parameter is an acceptance grade standard of the tunnel;
   obtaining first thermal imaging information of a first hot spot of a surface to be blasted, wherein the first hot spot is a same heat source generating unit arranged at a selected blasting hole point actually measured on the surface to be blasted based on the target blasting design parameters before a blasting hole arrangement; and
   calibrating actual hole spacing parameters based on the first thermal imaging information and the target blasting design parameters;
   wherein a hole spacing of a marked blasting hole is obtained by comparing spacings of the first hot spot on the first thermal imaging information and a blasting hole in the target blasting design parameters, so as to obtain the marked blasting hole with a deviation, wherein field personnel are capable of readjusting the marked blasting hole with the deviation to meet requirements in the target blasting design parameters.

2. The method according to claim 1, further comprising:
   obtaining second thermal imaging information of a second hot spot of the surface to be blasted after the blasting hole arrangement, wherein the second hot spot is the same heat source generating unit arranged at the selected blasting hole point after the blasting hole arrangement; and
   calibrating actual hole diameter parameters based on the second thermal imaging information and the target blasting design parameters.

3. The method according to claim 2, wherein calibrating the actual hole diameter parameters based on the second thermal imaging information and the target blasting design parameters comprises:
   determining a heat concentration range of the second hot spot based on the second thermal imaging information;
   predicting an actual hole diameter of an actual hole after the blasting hole arrangement based on the heat concentration range; and
   calibrating the actual hole diameter according to the target blasting design parameters.

4. The method according to claim 1, wherein,
   the blasting section design comprises groundwater information of the tunnel.

5. The method according to claim 1, wherein,
   the blasting quality parameters comprise an average linear overbreak amount; and
   the preset quality parameter comprises a preset linear overbreak amount.

6. The method according to claim 1, wherein,
   the blasting quality parameters comprise a local underbreak amount; and the preset quality parameter comprises a preset local underbreak amount.

7. The method according to claim 1, wherein performing the simulation with the three-dimensional finite element model based on the multiple groups of the blasting design parameters to obtain the blasting quality parameters, comprises:
   determining a surrounding rock grade based on rock mass properties of the tunnel;
   determining crustal stress of a surrounding rock based on the surrounding rock grade; and
   performing the simulation based on the crustal stress of the surrounding rock to obtain the blasting quality parameters.

8. An electronic device, comprising a memory and a processor, wherein the processor is used for implementing steps of the method for identifying the full-section excavation parameters of the tunnel with the broken surrounding rock according to claim 1 when executing a computer program stored in the memory.

9. A non-transitory computer-readable storage medium, storing a computer program, wherein when the computer program is executed by a processor, the method for identifying the full-section excavation parameters of the tunnel with the broken surrounding rock according to claim 1 is realized.

10. A device for identifying full-section excavation parameters of a tunnel with broken surrounding rock, comprising:
    an establishment unit, used for establishing a three-dimensional finite element model based on a section design and a blasting design of the tunnel;
    a simulation unit, used for performing a simulation with the three-dimensional finite element model based on multiple groups of blasting design parameters to obtain blasting quality parameters;
    a selection unit, used for selecting a group closest to a preset quality parameter from the multiple groups of the blasting design parameters as target blasting design parameters, wherein the preset quality parameter is an acceptance grade standard of the tunnel;
    an imaging unit, used for obtaining first thermal imaging information of a first hot spot of a surface to be blasted, wherein the first hot spot is a same heat source generating unit arranged at a selected blasting hole point actually measured on the surface to be blasted based on the target blasting design parameters before a blasting hole arrangement; and
    a calibration unit, used for calibrating actual hole spacing parameters based on the first thermal imaging information and the target blasting design parameters;
    wherein a hole spacing of a marked blasting hole is obtained by comparing spacings of the first hot spot on the first thermal imaging information and a blasting hole in the target blasting design parameters, so as to obtain the marked blasting hole with a deviation, wherein field personnel are capable of readjusting the marked blasting hole with the deviation to meet requirements in the target blasting design parameters.

* * * * *